United States Patent
Im

(10) Patent No.: US 9,831,432 B2
(45) Date of Patent: Nov. 28, 2017

(54) DISPLAY APPARATUS

(71) Applicant: Samsung Display Co., Ltd., Yongin-si, Gyeonggi-do (KR)

(72) Inventor: Chang-jin Im, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/163,509

(22) Filed: May 24, 2016

(65) Prior Publication Data

US 2017/0098769 A1 Apr. 6, 2017

(30) Foreign Application Priority Data

Oct. 1, 2015 (KR) .................. 10-2015-0138724

(51) Int. Cl.
*H01L 51/00* (2006.01)
*H01L 27/32* (2006.01)

(52) U.S. Cl.
CPC ...... *H01L 51/0031* (2013.01); *H01L 27/3244* (2013.01); *H01L 27/3297* (2013.01); *H01L 2251/5338* (2013.01)

(58) Field of Classification Search
None
See application file for complete search history.

(56) References Cited

U.S. PATENT DOCUMENTS 9,627,618 B2 * 4/2017 Jeong ................. H01L 51/0012
2010/0245271 A1 * 9/2010 Park ...................... H01L 51/524
345/173

FOREIGN PATENT DOCUMENTS

| JP | 2006-106086 A | 4/2006 |
| JP | 2006-235503 A | 9/2006 |
| KR | 10-2008-0001330 A | 1/2008 |
| KR | 10-2010-0078299 A | 7/2010 |
| KR | 10-2012-0075114 A | 7/2012 |
| KR | 10-2012-0139305 A | 12/2012 |

* cited by examiner

*Primary Examiner* — Lex Malsawma
(74) *Attorney, Agent, or Firm* — Lewis Roca Rothgerber Christie LLP

(57) ABSTRACT

Exemplary embodiments of the inventive concept provide is a display apparatus. The display apparatus includes a display panel having a signal pad part including signal pads, impression pads, resistance measurement pads, and alignment pads. The display apparatus also includes a flexible circuit board having a connection pad part including first, second, third, and fourth pads which respectively correspond to the signal, impression, resistance measurement, and alignment pads. The signal, impression, and the resistance measurement pads are arranged along a first direction with a first gap therebetween, and the first, second, and third pads are arranged along the first direction with a second gap therebetween, the second gap being less than the first gap.

17 Claims, 8 Drawing Sheets

DISPLAY APPARATUS

CROSS-REFERENCE TO RELATED APPLICATIONS

This application claims priority to and the benefit of Korean Patent Application No. 10-2015-0138724, filed on Oct. 1, 2015, the entire content of which is hereby incorporated by reference.

BACKGROUND

The present disclosure herein relates to a display apparatus.

Electronic equipment for providing an image to a user, such as smartphones, smart watches, digital cameras, laptop computers, navigations, and smart televisions, include an image display device for displaying an image. The image display apparatus includes a display panel for generating and displaying an image, and a driver for driving the display panel.

Various display panel types may be used as the display panel, such as liquid crystal display panels, organic light emitting display panels, electro wetting display panels, and electrophoretic display panels.

The driver for driving the display panel may be mounted on a flexible circuit board and connected to the display panel. The driver may be connected to the display panel via a plurality of pads located on the flexible circuit board and connected to the driver and a plurality of pads located on the display panel connected to a plurality of pads located on the flexible circuit board.

SUMMARY

The present disclosure provides a display apparatus that is capable of more accurately monitoring whether a contact error between a display panel and a flexible circuit board occurs.

Some embodiments of the inventive concept provide a display apparatus including a display panel including a signal pad part and a flexible circuit board including a connection pad part configured to be connected to the signal pad part. The signal pad part may include a plurality of signal pads, a plurality of impression pads with the plurality of signal pads therebetween, a plurality of resistance measurement pads with the plurality of signal pads and the plurality of impression pads therebetween, and a plurality of alignment pads with the plurality of signal pads, plurality of impression pads, and the plurality of resistance measurement pads therebetween. The plurality of alignment pads may be respectively connected to the resistance measurement pads. The connection pad part includes a plurality of first, second, third, and fourth pads which respectively correspond to the signal, impression, resistance measurement, and alignment pads. The signal, impression, and resistance measurement pads are arranged along a first direction with a first gap therebetween, and the first, second, and third pads are arranged along the first direction with a second gap therebetween, the second gap being less than the first gap.

In some embodiments, the signal pad part may be located on an area (e.g., a predetermined area) of one side (e.g., one end) of the display panel in a second direction (e.g., perpendicular to the first direction). The connection pad part may be located on an area (e.g., a predetermined area) of one side (e.g., one end) of the flexible circuit board which faces the one end of the display panel along the second direction.

In some embodiments, the alignment pads and the fourth pads may be arranged in the first direction.

In some embodiments, the signal pad part may include at least two impression pads, at least two resistance measurement pads, and at least two the alignment pads. The connection pad part may include at least two second pads, at least two third pads, and at least two fourth pads.

In some embodiments, each of the impression pads and the second pads may include a transparent electrode and a metal electrode surrounding the transparent electrode.

In some embodiments, the second pads of the connection pad part may be arranged along the first direction with the first pads therebetween, the third pads may be arranged along the first direction with the first and second pads therebetween, and the fourth pads may be arranged along the first direction with the first, second, and third pads therebetween.

In some embodiments, the resistance measurement pads may include first resistance measurement pads respectively located adjacent to the impression pads and second resistance measurement pads respectively located adjacent to the alignment pads. The resistance measurement pads may include third resistance measurement pads connected to upper portions of the first and second resistance measurement pads which are adjacent to each other and do not face one side (e.g., end) of the display panel in a second direction crossing (e.g., perpendicular to) the first direction.

In some embodiments, the signal pads, the impression pads, and the first and second resistance measurement pads may extend in the second direction, the first and second resistance measurement pads may be arranged in the first direction, and the third resistance measurement pad may extend in the first direction.

In some embodiments, the signal, impression, and first and second resistance measurement pads may be arranged along the first direction with the first gap therebetween.

In some embodiments, the alignment pads may include a first alignment pad connected to a corresponding second resistance measurement pad of the second resistance measurement pads to extend in the first direction, and a second alignment pad connected to the first alignment pad to extend in the second direction.

In some embodiments, the second alignment pads may be respectively connected to upper portions of the first alignment pads to extend upward in the second direction DR2, wherein the upper portions of the first alignment pads do not face one side (e.g., end) of the display panel in the second direction. A first end of the second alignment pads may be spaced at a first distance from a first end of the first alignment pads in the first direction. A second end of the second alignment pads may be spaced at the first distance from a second end of the first alignment pads that are adjacent to respective ends of the signal pad part.

In some embodiments, the third pads may include third_first pads respectively located adjacent to the second pads, and third_second pads respectively located adjacent to the fourth pads, wherein the first, second, third_first, and third_second pads may extend in the second direction, and the third_first and third_second pads may be arranged in the first direction.

In some embodiments, the fourth pads may include a fourth_first pad connected to the corresponding third_second pad to extend in the first direction, and a fourth_second pad connected to the fourth_first pad to extend in the second direction. The fourth_first pad may have a length in the first direction greater than that of the first alignment pad in the first direction, wherein the flexible circuit board is configured to elongate by heat.

In some embodiments, the fourth_second pads may be respectively connected to lower portions of the fourth_first pads to extend downward in the second direction, wherein the lower portions do not face one side (e.g., one end) of the flexible circuit board in the second direction. A second distance between the fourth_second pads and the third_second pads in the first direction may be greater than a first distance between the fourth_second pads and one end of each of the fourth_first pads adjacent to the ends of the connection pad part.

In some embodiments, the first alignment pad may be configured to overlap the fourth_first pad. One end of each of the first alignment pads adjacent to the ends of the signal pad part in the first direction may be configured to overlap one end of each of the fourth_first pads adjacent to the ends of the connection pad part in the first direction. The second alignment pad and the fourth_second pad may be configured to be aligned with each other in the second direction.

In some embodiments, the display apparatus may further include an anisotropic conductive film located between the signal pad part and the connection pad part. When the connection pad part is pressed to the signal pad part to connect the signal pad part to the connection pad part through the anisotropic conductive film, the first, second, and third pads may be connected to the signal, impression, and resistance measurement pads at the first gap.

In some embodiments, the third_first pad may be connected to areas (e.g., predetermined areas) of the first resistance measurement pad and the third resistance measurement pad that is adjacent to the first resistance measurement pad. The third_second pad may be connected to areas (e.g., predetermined areas) of the second resistance measurement pad and the third resistance measurement pad that is adjacent to the second resistance measurement pad.

BRIEF DESCRIPTION OF THE FIGURES

The above and other features of the present disclosure will become readily apparent by reference to the following detailed description when considered in conjunction with the accompanying drawings wherein.

DETAILED DESCRIPTION

Figure 1:
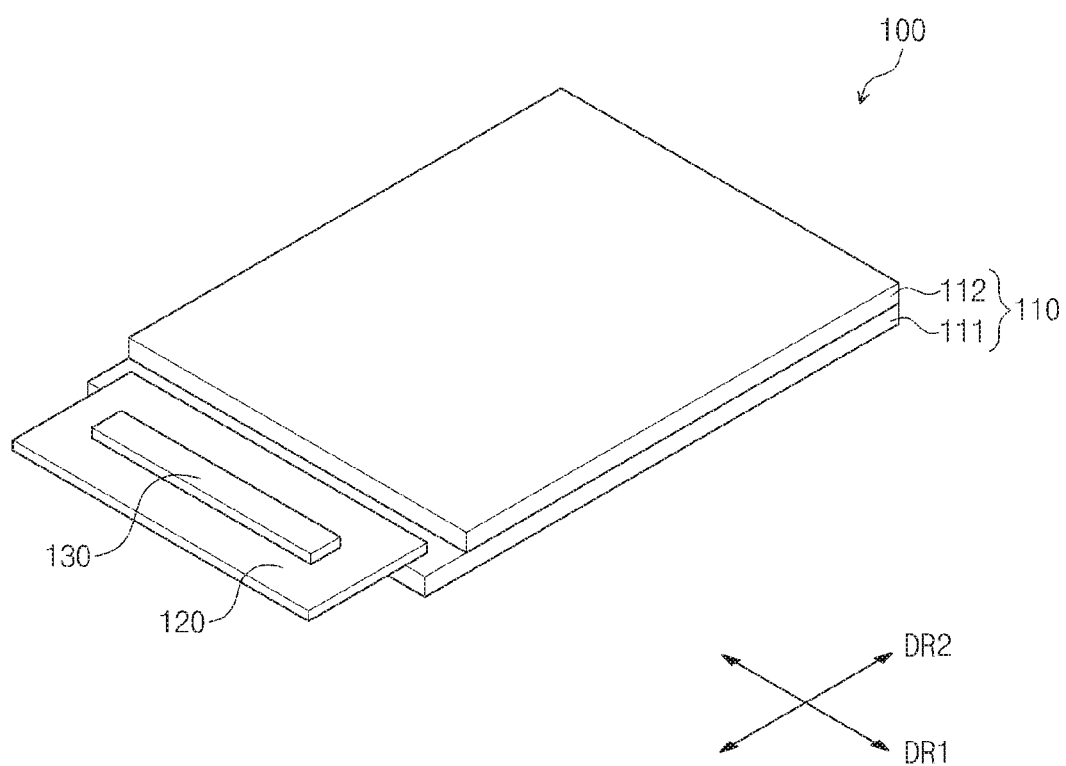
FIG. 1 is a perspective view of a display apparatus according to some embodiments of the inventive concept.

Hereinafter, exemplary embodiments of the inventive concept will be described below in more detail with reference to the accompanying drawings. In the following description, the same reference numerals will be assigned to elements and structures having substantially the same function or configuration, and equivalents thereof, and detailed descriptions thereof will be omitted in order to avoid redundancy.

In the drawings, the thickness of layers, films, and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

FIG. 1 is a perspective view of a display apparatus according to some embodiments of the inventive concept.

Referring to FIG. 1, a display apparatus 100 includes a display panel 110, a flexible circuit board 120 connected to the display panel 110, and a driver 130 mounted on the flexible circuit board 120.

The display panel 110 may have a short side in (e.g., extending in) a first direction DR1 and a long side in (e.g., extending in) a second direction DR2 crossing the first direction DR1 (e.g., the second direction DR2 may be in a direction perpendicular to the first direction DR1). The display panel 110 may be an organic light emitting display panel including one or more organic light emitting devices. However, it should be understood that the invention is not limited thereto or thereby. For example, various display panels such as a liquid crystal display panel, an electro wetting display panel, and/or an electrophoretic display panel may be used as the display panel 110.

The display panel 110 may include a base substrate 111 and a protection substrate 112 facing the base substrate 111 (e.g., the protection substrate 112 may be on the base substrate 111). A plurality of pixels, for example including the organic light emitting devices, may be on the base substrate 111, and the protection substrate 112 may be on the pixels. The protection substrate 112 may be an encapsulation substrate and/or thin film substrate.

The base substrate 111 may have a length greater than that of the protection substrate 112 in the second direction DR2. The driver 130 may be mounted on the flexible circuit board 120 having flexibility in the form of an integrated circuit chip. The flexible circuit board 120 may be connected to an area (e.g., a predetermined area) of the base substrate 111 in the second direction DR2 which is not overlapped by (e.g., not covered by) the protection substrate 112. The connection between the flexible circuit board 120 and the base substrate 111 may be in the form of a tape carrier package (TCP).

The driver 130 may be connected to a connection pad part on one side (e.g., end) of the flexible circuit board 120 in the second direction DR2. A signal pad part may be on one side (e.g., end) of the base substrate 111 that is not covered by the protection substrate 112 in the second direction DR2.

The connection pad part of the flexible circuit board 120 and the signal pad part of the base substrate 111 of the display panel 110 may be electrically connected to each other by an anisotropic conductive film. The connection between the connection pad part and the signal pad part will be described below.

The driver 130 may output driving power and driving signals. In some embodiments, the driving signals are provided to pixels of the display panel 110 through the connection pad part of the flexible circuit board 120 and the signal pad part of the base substrate 111.

The driving signals may include scan signals and data signals. The pixels receive the data signals in response to the scan signals. The pixels display an image corresponding to the data signals by using the driving power of the driver 130.

Figure 2:
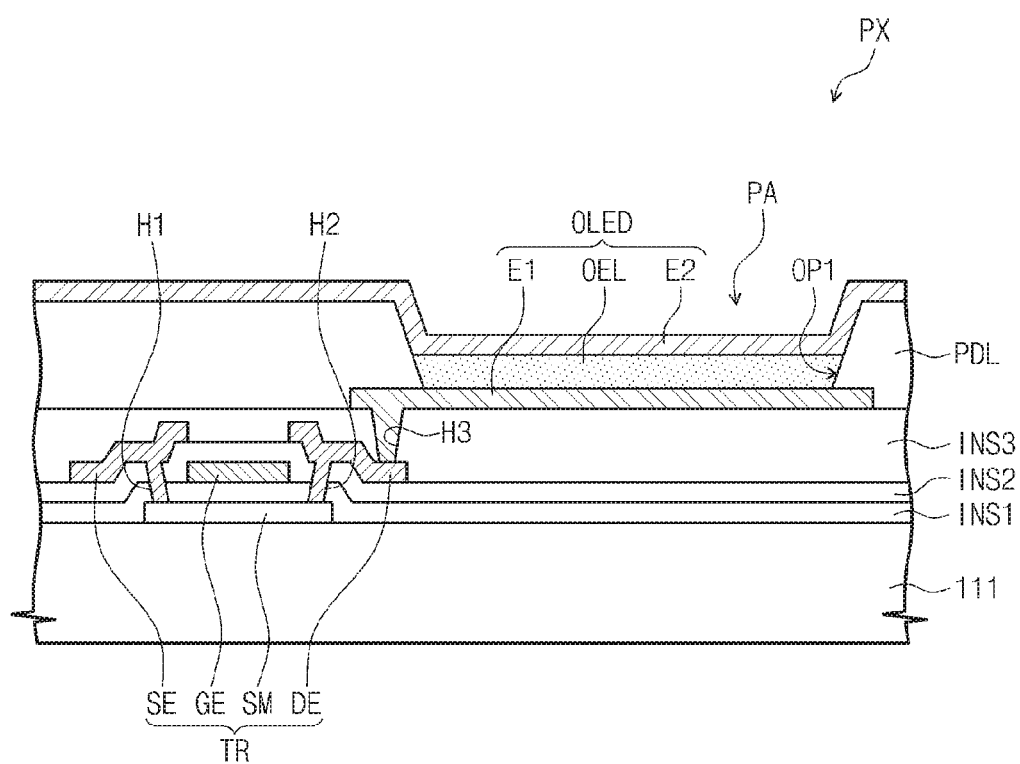
FIG. 2 is a view of a circuit configuration of one pixel disposed on a display panel of FIG. 1 according to some embodiments.

FIG. 2 is a view of a circuit configuration of one pixel on the display panel 110 of FIG. 1.

Referring to FIG. 2, a pixel PX includes an organic light emitting device OLED and a transistor TR for driving the organic light emitting device OLED. The transistor TR may be driven by the driving signal that received from the driver 130.

For example, the transistor TR is on the base substrate 111. The base substrate 111 may include a transparent insulation substrate formed of glass, quartz, and/or ceramic and/or may include a transparent flexible substrate formed of plastic. When the base substrate 111 includes a flexible substrate, the display panel 110 may be a flexible display panel having flexibility.

A semiconductor layer SM of the transistor TR may be on the base substrate 111. The semiconductor layer SM may include a semiconductor formed of an inorganic material such as amorphous silicon, polysilicon, and/or an organic semiconductor. The semiconductor layer SM may include an oxide semiconductor. The semiconductor layer SM may include a source region, a drain region, and a channel region between the source region and the drain region.

A first insulation layer INS1 is on the base substrate 111 to cover the semiconductor layer SM. The first insulation layer INS1 may be an inorganic insulation layer formed of an inorganic material.

A gate electrode GE of the transistor TR that overlaps (e.g., covers) the semiconductor layer SM is on the first insulation layer INS1. In detail, the gate electrode GE may overlap the channel region of the semiconductor layer SM.

A second insulation layer INS2 is on the first insulation layer INS1 to cover the gate electrode GE. The second insulation layer INS2 may be an interlayer dielectric. The second insulation layer INS2 may be an inorganic insulation layer formed of an inorganic material.

A source electrode SE and a drain electrode DE of the transistor TR are spaced apart from each other on the second insulation layer INS2. The source electrode SE may be connected to the source region of the semiconductor layer SM through a first contact hole H1 that passes through the first and second insulation layers INS1 and INS2. The drain electrode DE may be connected to the drain region of the semiconductor layer SM through a second contact hole H2 that passes through the first and second insulation layers INS1 and INS2.

A third insulation layer INS3 is on the second insulation layer INS2 to cover the source and drain electrodes SE and DE of the transistor TR. The third insulation layer INS3 may be an organic insulation layer formed of an organic material.

A first electrode E1 of the organic light emitting device OLED is on the third insulation layer INS3. The first electrode E1 may be connected to the drain electrode DE of the transistor TR through a third contact hole H3 that passes through the third insulation layer INS3. The first electrode E1 may be a pixel electrode or an anode electrode. The first electrode E1 may include a transparent electrode or a reflective electrode.

A pixel defining layer PDL, through which an area (e.g., a predetermined area) of the first electrode E1 is exposed, may be on the first electrode E1 and the third insulation layer INS3. The pixel defining layer PDL provides a first opening OP1 through which an area (e.g., a predetermined area) of the first electrode E1 is exposed. An area in which the first opening OP1 is defined may be a pixel area PA.

An organic emission layer OEL is on the first electrode E1 within the first opening OP1. The organic emission layer OEL may include an organic material that is capable of generating one light of red, green, and blue light. Thus, the organic emission layer OEL may generate one light of the red, green, and blue light. However, it should be appreciated that the invention is not limited thereto or thereby. For example, the organic emission layer OEL may generate white light by the combination of organic materials that respectively generate red, green, and blue light.

The organic emission layer OEL may include a low molecule organic material or high molecule organic material. The organic emission layer OEL may include a multi-layer including a hole injection layer (HIL), a transporting layer (HTL), an emission layer (EML), an electron transporting layer (ETL), and an electron injection layer (EIL). According to some exemplary embodiments, the hole injection layer HIL may be on the first electrode E1, and the transporting layer HTL, the electron transporting layer ETL, and the electron injection layer EIL may be successively stacked on the hole injection layer HIL.

A second electrode E2 may be on the pixel defining layer PDL and the organic emission layer OEL. The second electrode E2 may be a common electrode or cathode electrode. The second electrode E2 may be formed as a transparent electrode or reflective electrode.

When the display panel 110 is a front emission type organic light emitting panel, the first electrode E1 may be a reflective electrode, and the second electrode E2 may be a transparent electrode. When the display panel 110 is a rear emission type organic light emitting panel, the first electrode E1 may be a transparent electrode, and the second electrode E2 may be a reflective electrode.

The organic light emitting device OLED is formed on the pixel area PA, and may include the first electrode E1, the organic emission layer OEL, and the second electrode E2. That is, the organic light emitting device OLED may be on the pixel area PA and include the first electrode E1, the organic emission layer OEL, and the second electrode E2 on the pixel area PA.

The first electrode E1 may be a positive electrode that includes the hole injection layer HIL. The second electrode E2 may be a negative electrode that includes the electron injection layer EIL. However, the first electrode E1 and the second electrode E2 should be understood as not being limited thereto or thereby. For example, the first electrode E1 may be a negative electrode, and the second electrode E2 may be a positive electrode according to a driving method of the organic light emitting display panel.

The driving power for the organic emission layer OEL of the organic light emitting device OLED may be applied to the first electrode E1. Power having polarity opposite to that of the driving power may be applied to the second electrode E2. The driving power applied to the first electrode E1 may be power corresponding to an image signal.

In some embodiments, holes and electrons injected into the organic emission layer OEL may be coupled to each other to form excitons. The excitons may transition to a ground state, and the organic light emitting device OLED may emit light as a result. The organic light emitting device OLED may emit red, green, or blue light, according to a flow of current, to display predetermined image information.

Figure 3:
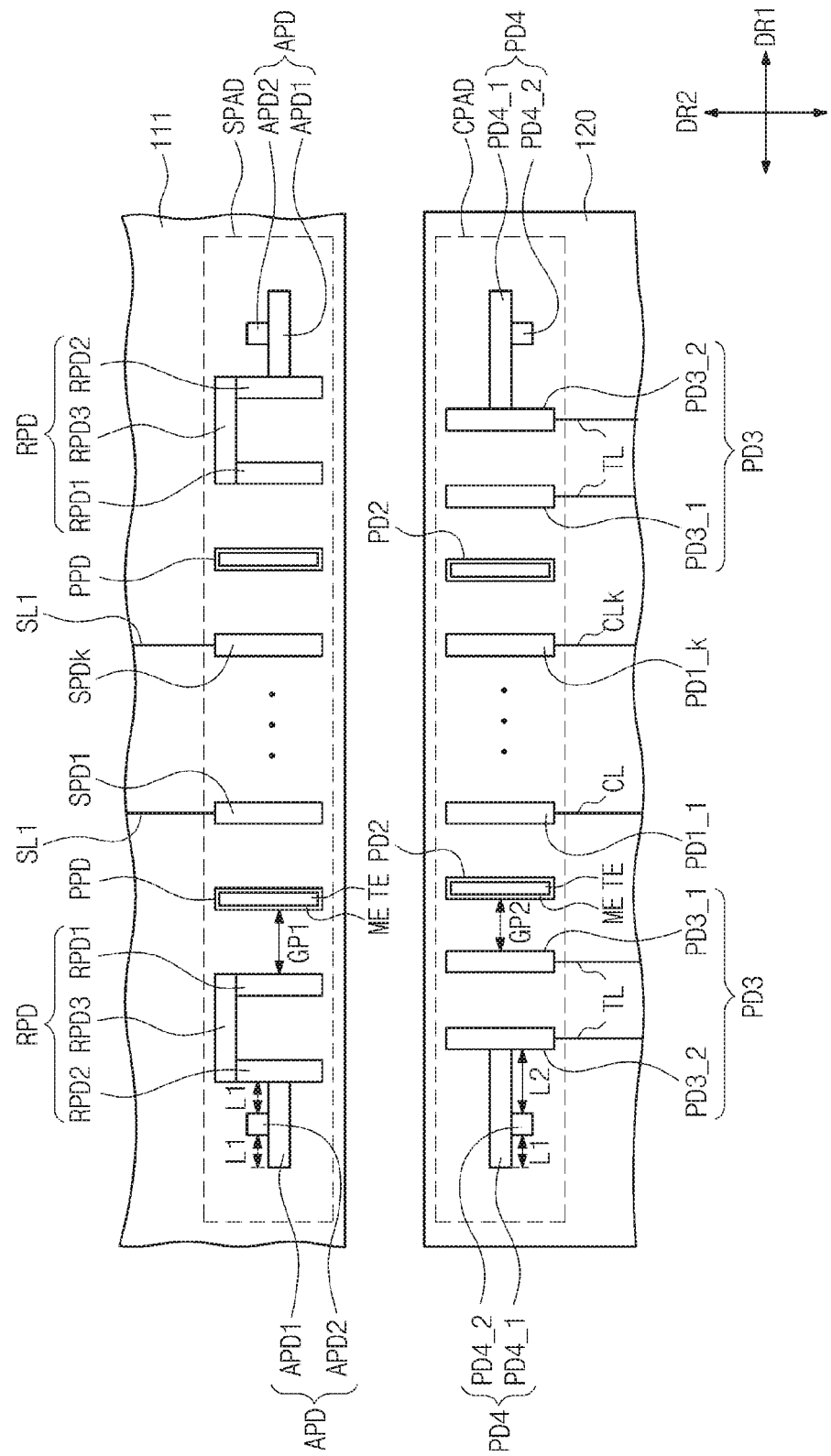
FIG. 3 is a view of a signal pad part of the display panel and a connection pad part of a flexible circuit board, which are illustrated in FIG. 1, according to some embodiments.
Figure 4:
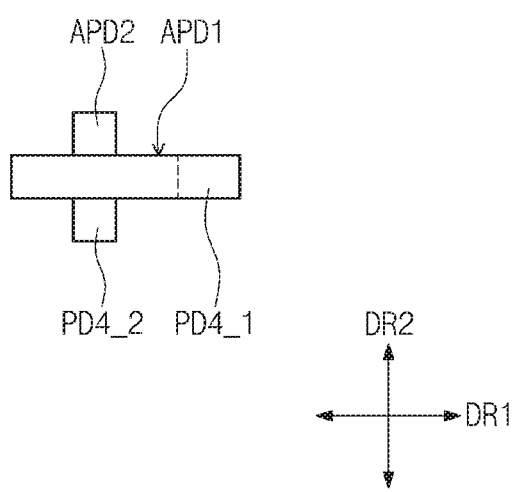
FIG. 4 is a view illustrating an aligned state of an alignment pad and a fourth pad of FIG. 3 according to some embodiments.
Figure 5:
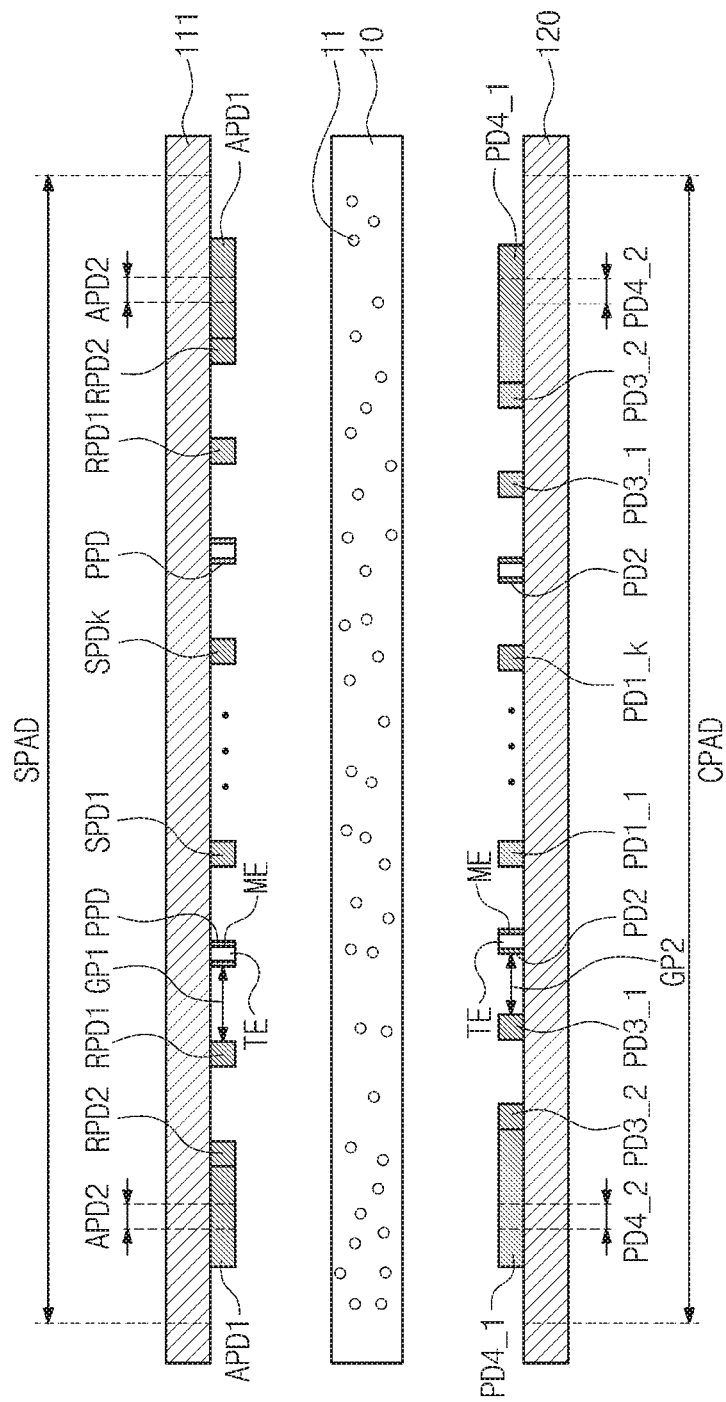
FIG. 5 is a cross-sectional view of the signal pad part and the connection pad part of FIG. 3.

FIG. 3 is a view of the signal pad part of the display panel and the connection pad part of the flexible circuit board according to some embodiments, which are illustrated in FIG. 1. FIG. 4 is a view illustrating an aligned state of an alignment pad and a fourth pad of FIG. 3. FIG. 5 is a cross-sectional view of the signal pad part and the connection pad part of FIG. 3.

Referring to FIGS. 3, 4, and 5, a signal pad part SPAD is on an area (e.g., a predetermined area) of one side (e.g., one end) of the base substrate 111 in the second direction DR2. A connection pad part CPAD is on an area (e.g., a predetermined area) of one side (e.g., one end) of the flexible circuit board 120, which faces one side (e.g., one end) of the base substrate 111. Each of the signal pad part SPAD and the connection pad part CPAD may extend in the first direction DR1.

Although the signal pad part SPAD and the connection pad part CPAD are spaced apart from each other in FIG. 3, it should be understood that the signal pad part SPAD and the connection pad part CPAD may be connected to each other (e.g., may overlap each other).

The signal pad part SPAD may include a plurality of signal pads SPD1 to SPDk, a plurality of impression pads PPD, a plurality of resistance measurement pads RPD, and a plurality of alignment pads APD. The signal pads SPD1 to SPDk, the impression pads PPD, the resistance measurement pads RPD, and the alignment pads APD may be arranged along the first direction DR1.

The impression pads PPD may be arranged with the signal pads SPD1 to SPDk therebetween, and the resistance measurement pads RPD may be arranged with the signal pads SPD1 and SPDk and the impression pads PPD therebetween. The alignment pads APD may be arranged with the signal pads SPD1 to SPDk, the impression pads PPD, and the resistance measurement pads RPD therebetween.

In some embodiments, the signal pad part SPAD may include at least two impression pads PPD, at least two resistance measurement pads RPD, and at least two alignment pads APD. The at least two alignment pads APD may be arranged on areas (e.g., predetermined areas) of respective sides of the signal pad part SPAD (e.g., on respective ends of the signal pad part SPAD along the first direction DR1).

The signal pads SPD1 to SPDk may extend in the second direction DR2 and may be arranged along the first direction DR1. The signal pads SPD1 to SPDk are connected to signal lines SL1 to SLk, and the signal lines SL1 to SLk extend and then are connected to pixels.

The impression pads PPD may extend in the second direction DR2 and may be arranged together with the signal pads SPD1 to SPDk along the first direction DR1. The impression pads PPD include a transparent electrode TE and a metal electrode ME surrounding the transparent electrode TE.

Each of the resistance measurement pads RPD may include a first resistance measurement pad RPD1, a second resistance measurement pad RPD2, and a third resistance measurement pad RPD 3 connected to upper portions of the first and second resistance measurement pads RPD1 and RPD2 that are adjacent to each other. The first resistance measurement pads RPD1 may be adjacent to the impression pads PPD, respectively. The second resistance measurement pads RPD2 may be adjacent to the alignment pads APD, respectively.

The first and second resistance measurement pads RPD1 and RPD2 extend in the second direction DR2 and are arranged with a predetermined gap in the first direction DR1. The third resistance measurement pad RPD3 extends in the first direction DR1 and is connected to upper portions of the first and second resistance measurement pads RPD1 and RPD2 (e.g., portions which do not face one side (e.g., one end) of the base substrate 111 in the second direction DR2).

The alignment pads APD include a first alignment pad APD1 that is connected to the corresponding second resistance measurement pad RPD2 of the second resistance measurement pads RPD2. The first alignment pad APD1 extends in the first direction DR1 and a second alignment pad APD2 that is connected to the first alignment pad APD1 extends in the second direction DR2.

The first alignment pad APD1 on an area (e.g., a predetermined area) of a left side of the signal pad part SPAD in the first direction DR1 extends in a left direction. The first alignment pad APD1 on an area (e.g., a predetermined area) of a right side of the signal pad part SPAD in the first direction DR1 extends in a right direction.

The second alignment pads APD2 are respectively connected to upper portions of the first alignment pads APD1 (e.g., portions which do not face one side (e.g., one end) of the base substrate 111 in the second direction) to extend upward in the second direction DR2. The second alignment pads APD2 are connected to areas (e.g., predetermined areas) of a central portion of the first alignment pads APD1 in the first direction DR1.

A distance between the second alignment pads APD2 and a first end of the first alignment pads APD1 along the first direction DR1 may be the same as the distance between the second alignment pads APD2 and a second end of the first alignment pads APD1 along the first direction DR1 (e.g., the second alignment pads APD2 may be centered along the first alignment pads APD1 along the first direction DR1). Here, the distance may be defined as a first distance L1.

The signal, impression, and first and second resistance measurement pads SPD1 to SPDk, PPD, RPD1, and RPD2 may be arranged to include a first gap GP1 along the first direction DR1 (e.g., each of the signal, impression, and first and second resistance measurement pads SPD1 to SPDk, PPD, RPD1, and RPD2 may have a first gap GP1 therebetween). The signal pads SPD1 to SPDk and the impression pads PPD may have the same length in the second direction DR2. The sum of the lengths of the first and second resistance measurement pads RPD1 and RPD2 in the second direction DR2 and the sum of the lengths of the second and third resistance measurement pads RPD2 and RPD 3 in the second direction DR2 may be the same as a length of each of the impression pads PPD in the second direction DR2.

In some embodiments, the connection pad part CPAD may include a plurality of first, second, third, and fourth pads PD1_1 to PD1_$k$, PD2, PD3, and PD4 that respectively correspond to the signal, impression, resistance measurement, and alignment pads SPD1 to SPDk, PPD, RPD, and APD. The first pads PD1_1 to PD1_$k$, the second pads PD2, the third pads PD3, and the fourth pads PD4 may be arranged along the first direction DR1.

When the signal pad part SPAD and the connection pad part CPAD are coupled to each other, the first pads PD1_1 to PD1_$k$ are connected to the signal pads SPD1 to SPDk, the second pads PD2 are connected to the impression pads PPD, and the third pads PD3 are connected to the resistance measurement pads RPD. Also, the fourth pads PD4 together with the alignment pads APD align the signal pad part SPAD with the connection pad part CPAD before the signal pad part SPAD is connected to the connection pad CPAD.

The second pads PD2 are arranged with the first pads PD1_1 to PD1_$k$ therebetween. The third pads PD3 are arranged with the first and second pads PD1_1 to PD1_$k$ and PD2 therebetween. The fourth pads PD4 are arranged with the first, second, and third pads PD1_1 to PD1_$k$, PD2, and PD3 therebetween.

In some embodiments, the connection pad part CPAD may include at least two second pads PD2, at least two third pads PD3, and at least two fourth pads PD4. The at least two fourth pads PD4 may be arranged on areas (e.g., predetermined areas) of respective sides (e.g., ends) of the connection pad part CPAD in the first direction DR1.

The first pads PD1_1 to PD1_$k$ may extend in the second direction DR2 and may be arranged along the first direction DR1. The first pads PD1_1 to PD1_$k$ are connected to the connection lines CL1 to CLk, and the connection lines CL1 to CLk extend and then connected to the driver 130.

The second pads PD2 extend in the second direction DR2 and may be arranged together with the first pads PD1_1 to PD1_$k$ in the first direction. The second pads PD2 include a transparent electrode TE and a metal electrode ME surrounding the transparent electrode TE, like the impression pads PPD.

The third pads PD3 include a third_first pad PD3_1 and a third_second pad PD3_2 that extend in the second direction DR2 and are arranged at a predetermined distance in the first direction DR1. The third_first pads PD3_1 may be adjacent to the second pads PD2, respectively. The third_second pads PD3_2 may be adjacent to the fourth pads PD4, respectively. The third_first pads PD3_1 and the third_second pads PD3_2 may be connected to test lines TL, and the test lines TL may extend in the second direction DR2. The test lines TL will be described more fully below.

The fourth pads PD4 include a fourth_first pad connected to the corresponding third_second pad PD3_2 of the third_second pads PD3 to extend in the first direction DR1 and a fourth_second pad PD4_2 connected to the fourth_first pad PD4_1 to extend in the second direction DR2.

The fourth_first pad PD4_1 on an area (e.g., a predetermined area) of a left side of the connection pad part CPAD in the first direction DR1 extends in a left direction. The fourth_first pad PD4_1 on an area (e.g., a predetermined area) of a right side of the connection pad part CPAD in the first direction DR1 extends in a right direction. The fourth_second pads PD4_2 are respectively connected to lower portions of the fourth_first pads PD4_1 (e.g., portions which do not face one side (e.g., one end) of the flexible circuit board 120 in the second direction DR2) to extend downward in the second direction DR2.

The fourth_second pads PD4_2 may be respectively located closer to the side (e.g., the end) of the connection pad part 120 in the first direction DR1 than a central portion of the fourth_first pads PD4_1 (e.g., the fourth_second pads PD4_2 may not be centered along the fourth_first pads PD4_1 in the first direction DR1). Thus, a second distance L2 between the fourth_second pads PD4_2 and the third_second pads PD3_2 in the first direction DR1 may be greater than a distance between the fourth_second pads PD4_2 and one side (e.g., one end) of the fourth_first pads PD4_1 adjacent to the side (e.g., ends) of the connection pad part 120 in the first direction DR1.

The first, second, and third pads PD1_1 to PD1_$k$, PD2, and PD3 may be arranged to include a second gap GP2 in the first direction DR1 that is smaller than the first gap GP1 in the first direction DR1. The first pads PD1_1 to PD1_$k$, the second pads PD2, and the third pads PD3 may have the same length in the second direction DR2. The length of the fourth_first pad in the first direction DR1 may be greater than that of the first alignment pad APD1 in the first direction DR1.

To connect the signal pad part SPAD of the base substrate 111 to the connection pad part CPAD of the flexible circuit board 120, the signal pad part SPAD and the connection pad part CPAD are arranged to overlap each other. The connection pad part CPAD is configured to be on the signal pad part SPAD. An anisotropic conductive film 10 including a plurality of conductive balls 11 may be between the signal pad part SPAD and the connection pad part CPAD (see, for example, FIG. 7). To more accurately align the signal pad part SPAD with the connection pad part CPAD, the alignment pad APD and the fourth pad PD4 are aligned with each other.

In detail, the first alignment pads APD1 of the alignment pads APD and the fourth_first pads PD4_1 of the fourth pads PD4 are arranged to overlap each other in the first direction DR1. One side (e.g., one end) of each of the first alignment pads APD1 adjacent to the sides (e.g., the ends) of the signal pad part SPAD in the first direction DR1 is arranged to overlap one side (e.g., end) of each of the fourth_first pads PD4_1 adjacent to the sides (e.g., end) of the connection pad part CPAD in the first direction DR1. The second alignment pad APD 2 and the fourth_second pad PD4_2 are arranged to be aligned with each other in the second direction DR2.

The connection pad part CPAD and the signal pad part SPAD may be aligned with each other by the alignment pad APD and the fourth pad PD4. The connection pad part CPAD may then pressed to the signal pad part SPAD, and thus, the connection pad part CPAD and the signal pad part SPAD may be connected to each other by the anisotropic conductive film 10.

Figure 6:
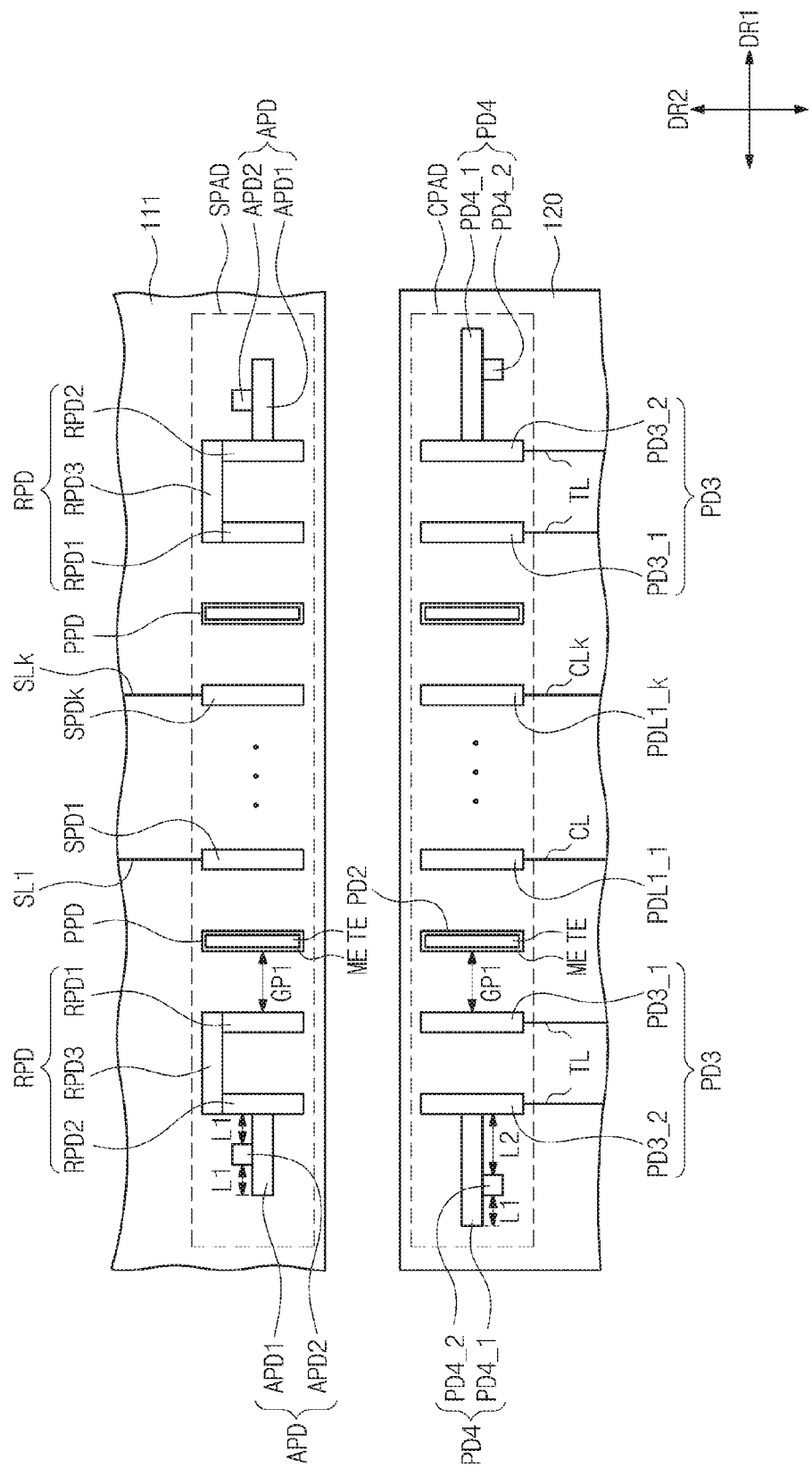
FIG. 6 is a view of the signal pad part and the connection pad part when the signal pad part is pressed and connected to the connection pad part according to some embodiments.
Figure 7:
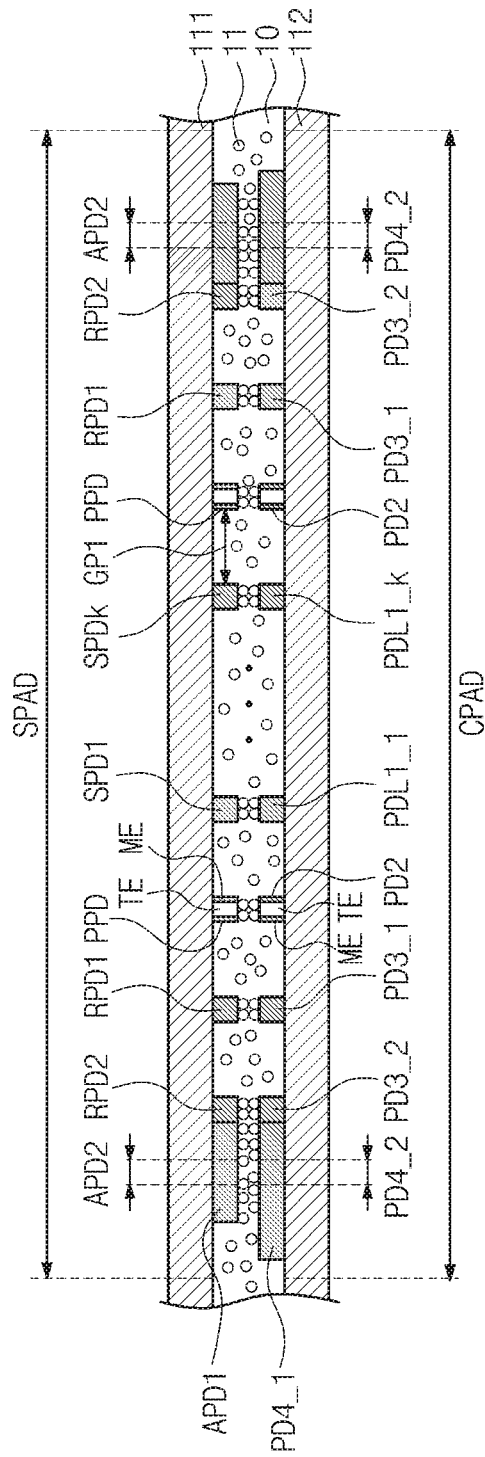
FIG. 7 is a cross-sectional view of the signal pad part and the connection pad part of FIG. 6.

FIG. 6 is a view of the signal pad part SPAD and the connection pad part CPAD when the signal pad part SPAD is pressed and connected to the connection pad part CPAD according to some embodiments. FIG. 7 is a cross-sectional view of the signal pad part SPAD and the connection pad part CPAD of FIG. 6.

For convenience of description, FIG. 6 illustrates a structure in which the signal pad part SPAD and the connection pad part CPAD are separately provided, but the invention is not limited thereto or thereby. FIG. 7 illustrates a cross-section of the connected structure between the signal pad part SPAD and the connection pad part CPAD.

Referring to FIGS. 6 and 7, when the connection pad part CPAD is pressed to the signal pad part SPAD, the connection pad part CPAD of the flexible circuit board 120 having a film shape may be expanded by heat. An expansion rate of the flexible circuit board 120 at a specific temperature may result in an elongation of the flexible circuit board 120.

When the connection pad part CPAD is expanded by heat, the gaps between the first, second, and third pads PD1_1 to PDk, PD2, and PD3 in the first direction DR1 may increase relative to the gaps before the connection pad part CPAD is pressed to the signal pad part SPAD. That is, when the connection pad part CPAD is pressed to the signal pad part SPAD, the gaps between the first, second, and third pads PD1_1 to PDk, PD2, and PD3 may be greater than the second gap GP2.

As described with reference to FIG. 3, each of the fourth_first pads PD4_1 may have a length greater than that of each of the first alignment pads APD1 in the first direction DR1. The length of each of the fourth_first pads PD4_1 in the first direction DR1 may be set to a length greater than that of each of the first alignment pads APD1 in the first direction DR1 when taking into consideration of the elongation of the flexible circuit board 120 (e.g., due to heat expansion). Because the length of the fourth_first pads PD4_1 is greater than that of each of the first alignment pads APD1 in the first direction DR1, the gaps between the first, second, and third pads PD1_1 to PD1_$k$, PD2, and PD3 that are between the fourth_first pads PD4_1 may be set to the second gap GP2 that less than the first gap GP1.

Because the length of each of the fourth_first pads PD4_1 is set taking into consideration of the elongation of the flexible circuit board 120 (e.g., due to heat expansion), when the connection pad part CPAD is pressed to the signal pad part SPAD and expanded by the heat, the gaps between the first, second, and third pads PD1_1 to PD1_$k$, PD2, and PD3 may increase to the first gap GP1 to overlap the signal, impression, and first and second resistance measurement pads SPD1 to SPDk, PPD, RPD1 and RPD2.

Thus, when the connection pad part CPAD is pressed to the signal pad part SPAD, the first, second, and third pads PD1_1 to PD1_$k$, PD2, and PD3 may be arranged to more accurately overlap the signal, impression, and first and second resistance measurement pads SPD1 to SPDk, PPD, RPD1 and RPD2.

The first, second, and third pads PD1_1 to PD1_$k$, PD2, and PD3 may be connected to the signal, impression, and first and second resistance measurement pads SPD1 to SPDk, PPD, RPD1 and RPD2 by the conductive balls 11 of the anisotropic conductive film 10 (see, for example, FIG. 7).

Figure 8:
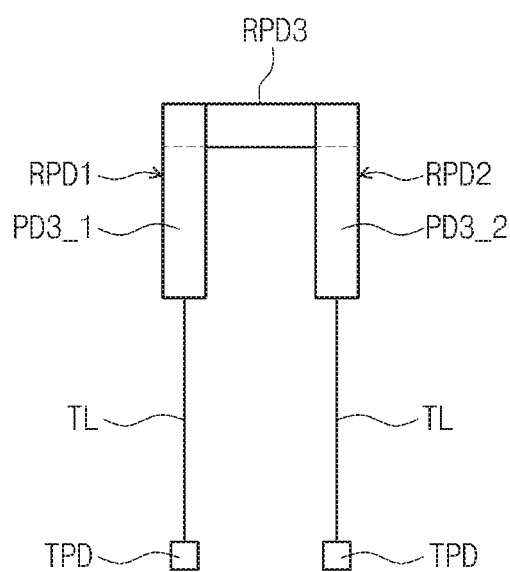
FIG. 8 is a view illustrating a connection state between one resistance measurement pad and the third pad of FIG. 6 according to some embodiments.

FIG. 8 is a view illustrating a connection state between one resistance measurement pad RPD and the third pad PD3 of FIG. 6 according to some embodiments.

Referring to FIG. 8, the third_first pad PD3_1 of the third pads PD3 is connected to areas (e.g., predetermined areas) of the first resistance measurement pad RPD1 of the resistance measurement pads RPD and the third resistance measurement pad RPD3 adjacent to the first resistance measurement pad RPD1. The third_second pad PD2_1 of the third pads PD3 is connected to areas (e.g., predetermined areas) of the second resistance measurement pad RPD2 of the resistance measurement pads RPD and the third resistance measurement pad RPD3 adjacent to the second resistance measurement pad RPD2. For example, the third_first pad PD3_1 and the third_second pad PD3_2 may be connected to areas (e.g., predetermined areas) of both sides (e.g., ends) of the third resistance measurement pad RPD3 in the first direction DR1.

The third_first pad PD3_1 and the third_second pad PD3_2 are connected to the test pads TPD through the test lines TL. A probe of measuring equipment (not shown) for measuring resistance may contact the test pads TPD to apply a predetermined voltage to the third pad PD3 and the resistance measurement pad RPD, thereby measuring resistance of the third pad PD3 and the resistance measurement pad RPD.

The base substrate 111 and the flexible circuit board 120 may be identified as having a contact error with respect to each other when the resistance values of the third pad PD3 and the resistance measurement pad RPD are greater than a predetermined value (e.g., a threshold value). In such a case, driving signals and a driving voltage may not be normally transmitted (e.g., properly transmitted) from the flexible circuit board 120 to the display panel 110. The base substrate 111 and the flexible circuit board 120 may be identified as having normal contact with respect to each other when the resistance values of the third pad PD3 and the resistance measurement pad RPD are less than the predetermined value.

Each of the transparent electrodes of the impression pads PPD and the second pads PD2 transmits light therethrough. Thus, when the base substrate 111 and the flexible circuit board 120 are coupled to each other and when observing upper portions of the impression pads PPD and the second pads PD2, the number of conductive balls 11 on the impression pads PPD may be observed through the transparent electrodes TE of the impression pads PPD and the second pads PD2.

The base substrate 111 and the flexible circuit board 120 may be identified as being normally pressed with respect to each other (e.g., properly pressed) when a predetermined number (e.g., threshold number) of conductive balls 11 or more are on the impression pads PPD and the second pads PD2. The base substrate 111 and the flexible circuit board 120 may be identified as being abnormally pressed with respect to each other when fewer than the predetermined number of conductive balls 11 are on the impression pads PPD and the second pads PD2.

According to some embodiments of the inventive concept, the resistance measurement pads RPD and the third pads PD3, as well as the impression pads PPD and the second pads PD2 may be more accurately aligned with each other to more accurately monitor whether a contact error between the display panel 110 and the flexible circuit board 120 occurs.

Therefore, the display apparatus 100 according to some embodiments of the inventive concept may more accurately monitor whether a contact error between the display panel 110 and the flexible circuit board 120 occurs.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
a display panel comprising a signal pad part; and
a flexible circuit board comprising a connection pad part configured to be connected to the signal pad part,
wherein the signal pad part comprises:
a plurality of signal pads;
a plurality of impression pads with the plurality of signal pads therebetween;
a plurality of resistance measurement pads with the plurality of signal pads and the plurality of impression pads therebetween; and
a plurality of alignment pads with the plurality of signal pads, the plurality of impression pads, and the plurality of resistance measurement pads therebetween, the plurality of alignment pads being respectively connected to the resistance measurement pads,
wherein the connection pad part comprises a plurality of first, second, third, and fourth pads which respectively correspond to the signal, impression, resistance measurement, and alignment pads, and
wherein the signal, the impression, and the resistance measurement pads are arranged along a first direction with a first gap therebetween, and the first, second, and third pads are arranged along the first direction with a second gap therebetween, the second gap being less than the first gap.

2. The display apparatus of claim 1, wherein the signal pad part is arranged on an area of one end of the display panel along a second direction perpendicular to the first direction, and the connection pad part is arranged on an area of one end of the flexible circuit board which faces the one end of the display panel along the second direction.

3. The display apparatus of claim 1, wherein the alignment pads and the fourth pads are arranged along the first direction.

4. The display apparatus of claim 1, wherein signal pad part comprises at least two impression pads, at least two resistance measurement pads, and at least two alignment pads, and the connection pad part comprises at least two second pads, at least two third pads, and at least two fourth pads.

5. The display apparatus of claim 1, wherein each of the impression pads and the second pads comprises:
a transparent electrode; and
a metal electrode surrounding the transparent electrode.

6. The display apparatus of claim 1, wherein the second pads of the connection pad part are arranged along in the first direction with the first pads therebetween, the third pads are arranged along the first direction with the first and second pads therebetween, and the fourth pads are arranged along the first direction with the first, second, and third pads therebetween.

7. The display apparatus of claim 1, wherein the resistance measurement pads comprise:
first resistance measurement pads respectively adjacent to the impression pads;
second resistance measurement pads respectively adjacent to the alignment pads; and
third resistance measurement pads connected to upper portions of the first and second resistance measurement pads which are adjacent to each other and do not face an end of the display panel along a second direction crossing the first direction.

8. The display apparatus of claim 7, wherein the signal pads, the impression pads, and the first and second resistance measurement pads extend in the second direction, the first and second resistance measurement pads are arranged along the first direction, and the third resistance measurement pad extends in the first direction.

9. The display apparatus of claim 7, wherein the signal, impression, and first and second resistance measurement pads are arranged along the first direction with the first gap therebetween.

10. The display apparatus of claim 7, wherein the alignment pads comprise:
a first alignment pad connected to a corresponding second resistance measurement pad of the second resistance measurement pads to extend in the first direction; and
a second alignment pad connected to the first alignment pad to extend in the second direction.

11. The display apparatus of claim 10, wherein the second alignment pads are respectively connected to upper portions of the first alignment pads to extend upward in the second direction, wherein the upper portions of the first alignment pads do not face an end of the display panel in the second direction, and the second alignment pads are configured to be spaced at a first distance from a first end of the first alignment pads along the first direction, and the alignment pads are configured to be spaced at the first distance from a second end of the first alignment pads that are adjacent to respective ends of the signal pad part.

12. The display apparatus of claim 10, wherein the third pads comprise:

third_first pads respectively located adjacent to the second pads; and third_second pads respectively located adjacent to the fourth pads, wherein the first, second, third_first, and third_second pads extend in the second direction, and the third_first and third_second pads are arranged along the first direction.

13. The display apparatus of claim 12, wherein the fourth pads comprise:

a fourth_first pad connected to a corresponding third_second pad of the third pads to extend in the first direction; and a fourth_second pad connected to the fourth_first pad to extend in the second direction, wherein the fourth_first pad has a length greater than that of the first alignment pad in the first direction, wherein the flexible circuit board is configured to elongate by heat.

14. The display apparatus of claim 13, wherein the fourth_second pads are respectively connected to lower portions of the fourth_first pads to extend downward in the second direction, wherein the lower portions of the fourth_first pads do not face an end of the flexible circuit board in the second direction, and a second distance between the fourth_second pads and the third_second pads in the first direction is greater than a first distance between the fourth_second pads and an end of each of the fourth_first pads adjacent to the ends of the connection pad part in the first direction.

15. The display apparatus of claim 13, wherein the first alignment pad is configured to overlap the fourth_first pad, one end of each of the first alignment pads adjacent to the ends of the signal pad part in the first direction is configured to overlap one end of each of the fourth_first pads adjacent to the ends of the connection pad part in the first direction, and the second alignment pad and the fourth_second pad are configured to be aligned with each other in the second direction.

16. The display apparatus of claim 12, further comprising an anisotropic conductive film between the signal pad part and the connection pad part, wherein when the connection pad part is pressed to the signal pad part to connect the signal pad part to the connection pad part through the anisotropic conductive film, the first, second, and third pads are connected to the signal, impression, and resistance measurement pads arranged with the first gap therebetween.

17. The display apparatus of claim 16, wherein the third_first pad is connected to areas of the first resistance measurement pad and the third resistance measurement pad that is adjacent to the first resistance measurement pad, and the third_second pad is connected to areas of the second resistance measurement pad and the third resistance measurement pad that is adjacent to the second resistance measurement pad.

* * * * *